United States Patent [19]

Hartman et al.

[11] 4,230,997
[45] Oct. 28, 1980

[54] BURIED DOUBLE HETEROSTRUCTURE LASER DEVICE

[75] Inventors: Robert L. Hartman, Warren Township, Somerset County, N.J.; Marc Ilegems, Renens, Switzerland; Louis A. Koszi, Scotch Plains; Wilfried R. Wagner, Chatham, both of N.J.

[73] Assignee: Bell Telephone Laboratories, Incorporated, Murray Hill, N.J.

[21] Appl. No.: 7,429

[22] Filed: Jan. 29, 1979

[51] Int. Cl.³ .............................................. H01S 3/19
[52] U.S. Cl. .............................. 331/94.5 H; 148/174; 148/175; 357/18; 357/56
[58] Field of Search .................... 331/94.5 H; 357/18, 357/17, 56, 59, 60; 148/174, 175

[56] References Cited

U.S. PATENT DOCUMENTS

| | | | |
|---|---|---|---|
| 3,833,435 | 9/1974 | Logan et al. | 331/94.5 H X |
| 4,111,725 | 9/1978 | Cho et al. | 148/175 |
| 4,163,952 | 8/1979 | Thompson et al. | 331/94.5 H |

FOREIGN PATENT DOCUMENTS 1258360 12/1971 United Kingdom ............... 331/94.5 H

OTHER PUBLICATIONS

Tsukada, "GaAs-Ga$_{1-x}$Al$_x$As Buried-Heterostructure Injection Lasers," *Journal of Applied Physics*, vol. 45, No. 11, Nov. 1974, pp. 4899–4906.

Lee et al., "Single-Transverse-Mode Injection Lasers With Embedded Stripe Layer Grown by Molecular Beam Epitaxy," vol. 29, No. 3, 1 Aug. 1976, pp. 164–166.

*Primary Examiner*—James W. Davie
*Attorney, Agent, or Firm*—Michael J. Urbano

[57] ABSTRACT

A buried double heterostructure laser device isdescribed. A wafer of double heterostructure material is formed into narrow mesa stripes. A native oxide coating is formed on the side walls of the mesa. Semiconductor material having an index of refraction which is closely matched to the index of the active region is deposited over the mesa structure. High resistivity polycrystalline material forms on the native oxide and monocrystalline material forms on the top of the mesa. Vertical carrier and optical confinement is achieved by the higher bandgap cladding layers of the double heterostructure configuration. The native oxide acts as an electrical insulator to confine pumping current to the mesa. The closely matched polycrystalline material confines light parallel to the junction plane and prevents excitation of higher order transverse modes. Devices have been fabricated which exhibit cw threshold currents at room temperature as low as 55 mA.

10 Claims, 1 Drawing Figure

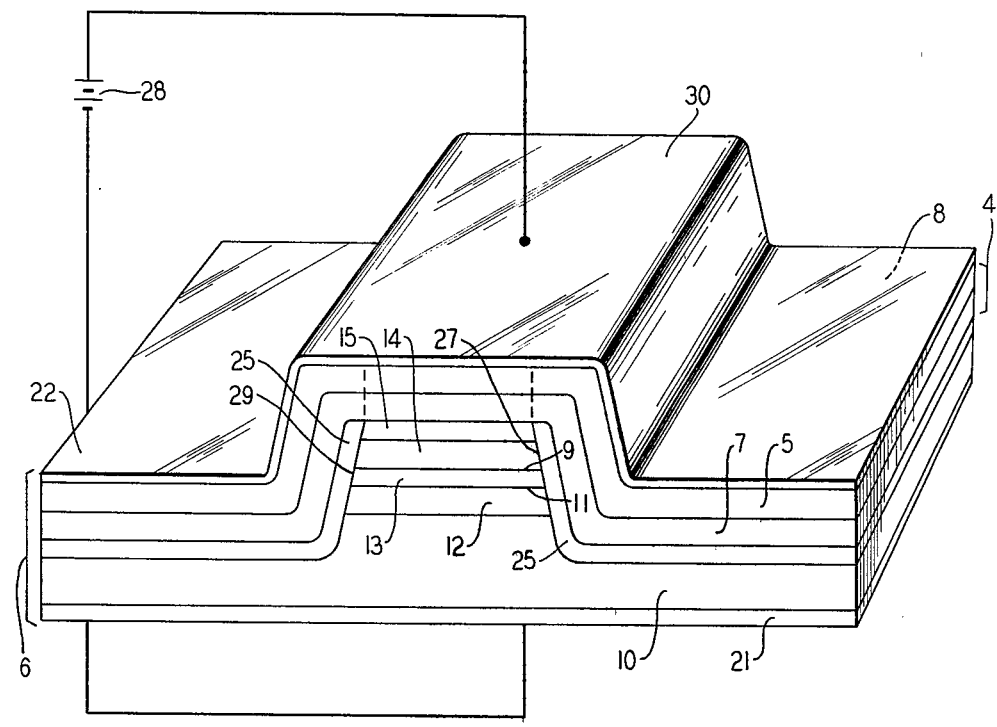

BURIED DOUBLE HETEROSTRUCTURE LASER DEVICE

CROSS REFERENCE

This application was concurrently filed with application Ser. No. 007,422 filed Jan. 29, 1979 by R. L. Hartman et al entitled "Selective Plasma Etching of Dielectric Masks in the Presence of Native Oxides of Group III-V Compound Semiconductors," and assigned to the assignee of the present invention.

TECHNICAL FIELD

This invention relates to semiconductor double heterostructure (DH) lasers, and more particularly to buried double heterostructure lasers (BDH) wherein a filamentary active region is surrounded by a higher bandgap material.

BACKGROUND OF THE INVENTION

Semiconductor lasers used as sources for an optical communications system should have the following characteristics: (1) low laser oscillation initiation current (threshold) which decreases the input power and increases the device lifetime and (2) single transverse mode operation for efficient coupling of light output to an optical fiber. The development of the DH laser structure wherein a binary active region is sandwiched between wider bandgap ternary cladding layers brought about a decrease in threshold current and made cw operation at room temperature possible. The success of the DH structure is due to the confinement of light and carriers perpendicular to the junction plane by the two heterojunctions formed at the interfaces between the binary and ternary. Lateral control of light and carriers could further reduce threshold current. Furthermore, limiting the beam width is conducive to oscillation in the lower order modes.

Stripe geometry lasers utilizing an oxide stripe or proton bombarded stripe were developed to constrain the pumping current to a narrow channel. However, the effectiveness of the stripe geometry lasers is limited by their inability to confine light parallel to the junction plane. Mesa-stripe lasers were developed wherein the active region is located in a mesa encapsulated, typically, by glass or high aluminum content ternary so that there is a large discontinuity in index of refraction which confines light to the active region. However, glass having a large discontinuity in index of refraction tends to excite higher order modes.

Buried double heterostructures wherein a filamentary binary active region is completely surrounded by a ternary have low thresholds and operate in the zero order mode. However, some means must still be employed to confine pumping current to the filamentary active region. Tsukada in *Journal of Applied Physics*, Vol. 45, No. 11, November 1974 suggests using the oxide stripe and selective diffusion of zinc technique to align the electrical contact with the active region.

SUMMARY OF THE INVENTION

We have developed a buried double heterostructure wherein there is lateral control of the pumping current and stimulated light. The structure basically comprises a multilayered double heterostructure semiconductor wafer etched to form a mesa, a native oxide coating formed on the side walls of the mesa, and another semiconductor layer deposited over the mesa, forming polycrystalline material contiguous with the oxide and monocrystalline material contiguous with the top of the mesa.

The heterojunctions of the DH structure confine carriers and light perpendicular to the junction plane in the usual manner. The oxide is electrically insulating and confines pumping current to the mesa stripe. Thus, the electrical contacts and the active region are self-aligned. The overgrowth layer has a higher bandgap and a smaller, but closely matched, index of refraction to confine carriers and light. In particular, the small discontinuity in index of refraction allows light to spread from the active region into the overgrowth layer without exciting higher order modes. Devices fabricated as described have threshold currents as low as 55 mA.

BRIEF DESCRIPTION OF THE DRAWING

The invention, together with its various features and advantages, can be more easily understood from the following more detailed description taken in conjunction with the accompanying drawing, in which the sole FIGURE is a perspective view of an illustrative embodiment of a buried double heterostructure laser according to the invention.

DETAILED DESCRIPTION

Turning now to the FIGURE, an illustrative embodiment of the device structure is shown which can best be described by the method of fabrication. A double heterostructure wafer is grown by epitaxial techniques. Liquid phase epitaxy (LPE) is preferred since it produces material with high radiative recombination efficiency. The heterostructure basically comprises a single crystal substrate (semiconductor body) 10 on which are epitaxially grown a wide bandgap first cladding layer 12, a narrower bandgap active region 13, and a wide bandgap second cladding layer 14. A capping layer 15 is optionally included for an alternative contact metallization. Illustratively, body 10 comprises GaAs, cladding layers 12 and 14 comprise $Al_xGa_{1-x}As$ ($0.24 \leq x \leq 0.36$) and active region 13 comprises $Al_yGa_{1-y}As$ ($0 \leq y \leq 0.1$). Cladding layers 12 and 14 are generally of opposite conductivity type and are lattice matched to the material of region 13 to form defect free heterojunctions 9 and 11 at the interface with active region 13. The higher bandgap cladding layers confine radiation in the dimension perpendicular to the junction plane. The larger bandgap of the cladding layers also confines carriers so that recombination of holes and electrons takes place in the active region 13 when the p-n junction is forward biased by means of source 28 connected between ohmic contacts 21 and 22. Heat sink means (not shown) are generally attached to contact 22.

Mesa structure 30 is formed so that it extends parallel to the direction of light propagation. Preferred technique for forming the mesa is sequential anodization and stripping because it enables precise control over the depth of semiconductor consumed by adjustment of the voltage applied. For GaAs, for example, approximately 13 Angstroms are consumed per volt applied and the corresponding oxide thickness is 20 Angstroms. Furthermore, we have found that a silicon dioxide etching mask can withstand 20–30 anodic growths and removals enabling a depth of 3.5 μm or more to be etched. High mesas are desirable so that the mesa side walls are substantially straight in a vertical direction bordering active region 13 to aid in mode control.

The preferred mesa-forming technique comprises the following steps: (1) deposition of silicon dioxide on the multilayered structure; (2) delineation of stripes by conventional photolithographic techniques; (3) anodizing by applying a voltage across the exposed semiconductor in an oxidizing solution such as the peroxide or water or glycol mixture described by Logan et al, *Journal of Electrochemical Society*, Vol. 120, 1385 (1973); Spitzer et al, *Journal Electrochemical Society*, Vol. 122, 39 (1975); or Hasegawa et al, *Journal Electrochemical Society*, Vol. 123, 713 (1976); (4) stripping the anodic oxide by immersion in an etchant such as ammonium hydroxide; and (5) repeating steps (3) and (4) until the bottom of the mesa is in layer 12 or substrate 10.

The last grown oxide layer 25 is allowed to remain on the mesa side walls 27 and 29. In order to remove the silicon dioxide mask from the top of the mesa without also removing the oxide, two procedures are preferred. The first is plasma etching in a suitable atmosphere (e.g., a halocarbon and oxygen) which selectively removes dielectric materials such as silicon dioxide. The plasma etching technique is described more fully by R. L. Hartman et al (Case 5-5-8-32) in a copending application filed concurrent herewith. The second technique involves heat stabilization of the native oxide to render it insoluble to common chemical etchants for the silicon oxide. A low temperature bake in a nitrogen atmosphere at 100–300 degrees C. for 2 hours, followed by a gradual increase to 600 degrees C. for 3 hours is sufficient. Then, the silicon dioxide mask located on the top of the mesa stripe is removed by wet chemical etching, leaving a mesa stripe 30 etched into layer 12 or substrate 10. The mesa has a stabilized oxide coating 25 on its side walls and a top surface comprising capping layer 15. Typically, the mesa stripe width is 4–8 $\mu$m and the height is at least 2.5 to 3.5 $\mu$m. The mesa extends the full length of the laser device, typically, 100–380 $\mu$m.

An overgrowth layer 4 comprising one or more layers (5 and 7) of semiconductor is deposited over the mesa structure. Molecular beam epitaxy (MBE) is a preferred method for deposition of layer 4 since it doesn't adversely affect the underlying structure. In contrast, the oxide would crystallize and be rendered useless as a dielectric at the melt temperature required in LPE technology. Furthermore, MBE will grow over aluminum containing compounds which have been exposed to the atmosphere whereas, LPE growth is hindered by the presence of aluminum oxide. An MBE technique similar to that described in U.S. Pat. No. 3,928,092 issued to W. C. Ballamy and A. Y. Cho on Dec. 23, 1975 is suitable. High resistivity polycrystalline material forms over the native oxide and monocrystalline material forms on the top of the mesa. Illustratively, the overgrowth comprises two layers, a p-type layer 7 of $Al_xGa_{1-x}As$ and a p++-type layer 5 of GaAs. Typically, the thickness of composite layer 4 is substantially the same as the height of the mesa. Alternately, the structure can be fabricated by proceeding with the above-mentioned MBE growth without removing the silicon dioxide mask. This produces polycrystalline material over the entire surface of layer 25 and the silicon dioxide mask. The polycrystalline MBE material directly over layer 15 is then removed using an undercutting-liftoff etchant, such as buffered HF, which exposes layer 15 for contacting.

The final oxide thickness should be small in comparison to the wavelength of the oscillating light so that layer 4 is the reflecting medium for radiation penetrating the side walls of the mesa. For GaAs, the wavelength of stimulated emission is approximately 0.25 $\mu$m. Therefore, the oxide coating thickness should be about 0.1 $\mu$m thick. The $Al_xGa_{1-x}As$ overgrowth layer should have an index of refraction which is closely matched (approximately 0.1 less) to that of the active region material. Therefore, light will be guided in the active region and higher order modes will not be excited since the light can spread into layer 4.

Contacts 21 and 22 are formed by conventional methods. Broad area contacts are self-aligning with respect to the active region of the mesa since the electrically insulative oxide on the mesa side walls confines current to the mesa. Opposite end surfaces 6 and 8 are typically cleaved facets formed parallel to one another and perpendicular to the layers to define an oscillator cavity resonator. The cleaved facets are partially transmissive to permit output of a portion of the radiation from the resonator. Typically, the cleaved facets terminate the mesa structure as shown in the figure. It is also possible to have the mesa structure terminate short of the mirror facets in a configuration sometimes termed a passive mirror structure. This structure may be fabricated by forming a rectangular mesa structure along both the resonator axis and perpendicular to it with native oxide deposited on all four sidewalls. It would also require, however, the addition of a lower index of refraction cladding layer on top of a relatively higher index of refraction waveguide layer grown over the mesa to form a waveguide between the ends of the active region and the distant mirrors. Alternatively, in an integrated optical circuit, one or both mirrors could be formed instead by distributed feedback means such as diffraction gratings.

In an illustrative example, we fabricated a double heterostructure by liquid phase epitaxy. The DH structure comprised an n-type GaAs substrate doped with silicon to $2 \times 10^{18}/cm^3$ with the following contiguous layers grown thereon in the order recited: an $Al_{0.36}Ga_{0.64}As$ layer 2.5 $\mu$m thick doped n-type with tellurium to $4 \times 10^{17}/cm^3$; an $Al_{0.08}Ga_{0.92}As$ layer 0.2 $\mu$m thick doped p-type with germanium to $1 \times 10^{17}/cm^3$; an $Al_{0.6}Ga_{0.64}As$ layer 1.2 $\mu$m thick doped p-type with germanium to $1 \times 10^{17}/cm^3$; and a GaAs layer 1 $\mu$m thick doped p-type with germanium to $1 \times 10^{18}/cm^3$. A mesa having a width of 8 $\mu$m across its top surface and a height of 2.5 $\mu$m was formed by the sequential anodic oxidation and stripping technique described above. The last oxide layer formed was allowed to remain on the mesa side walls. The oxide was stabilized by heating the wafer in a vacuum chamber for 2 hours at 125–200 degrees C. and then gradually raising the temperature to 450 degrees and then to 580 degrees. After removal of the silicon dioxide mask in buffered HF, the final oxide thickness on the mesa side walls was about 0.1 $\mu$m. An $Al_{0.36}Ga_{0.64}As$ layer doped p-type with beryllium to $4 \times 10^{17}/cm^3$ was grown by molecular beam epitaxy over the mesa to a thickness of about 2 $\mu$m. Another layer of p++-type GaAs was deposited on the $Al_{0.36}Ga_{0.64}As$. Electrical contacts were formed by conventional means on the substrate and on the final p++-type GaAs layer. The laser wafer was cleaved to a length of 380 $\mu$m to produce parallel end faces to define a laser oscillation cavity.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the foregoing discussion is directed to GaAs/AlGaAs, the laser can be fabricated from other semiconductor materials such as InP/GaAsInP, GaAs/AlGaAsP, GaAsSb/AlGaAsSb, AlGaSb/InAsSb, etc.

We claim:

1. A double heterostructure laser device including a multilayered structure comprising a semiconductor body of one conductivity type, a wide bandgap first cladding layer of the same conductivity type disposed on a major surface of said body, a narrower bandgap active region disposed on said first layer, and a wide bandgap second cladding layer of opposite conductivity type disposed on said active region, said active region being capable of emitting stimulated radiation when said cladding layers are forward biased, said multilayered structure having the shape of an elongated mesa which extends parallel to the direction of propagation of said radiation, electrode means for applying said forward bias and means for forming an optical resonator for said radiation CHARACTERIZED IN THAT a native oxide coating is disposed on the side walls of said mesa and an overgrowth layer is disposed on said mesa, said overgrowth layer comprising polycrystalline material contiguous with said oxide and monocrystalline material contiguous with the top of said mesa.

2. The device of claim 1 wherein said oxide coating comprises a heat stabilized native oxide.

3. The device of claim 1 wherein the material of said overgrowth layer has an index of refraction which is closely matched to the index of refraction of said active region.

4. The device of claim 3 wherein said material has an index of refraction which is between 0 and 0.1 less than the index of refraction of said active region.

5. The device of claim 1 wherein said overgrowth layer comprises more than one layer of material.

6. The device of claim 1 wherein said multilayered structure is formed by liquid phase epitaxy and said overgrowth layer is formed by molecular beam epitaxy.

7. The device of claim 1 wherein said semiconductor is aluminum gallium arsenide.

8. The device of claim 1 wherein said body comprises GaAs, said first and second cladding layers comprise $Al_xGa_{1-x}As$ where $0.24 \leq x \leq 0.36$, said active region comprises $Al_yGa_{1-y}As$ where $0 \leq y \leq 0.1$, and said overgrowth layer comprises $Al_xGa_{1-x}As$.

9. A double heterostructure device comprising:

a multilayered structure comprising an n-type GaAs substrate, an n-type $Al_xGa_{1-x}As$ ($0.24 \leq x \leq 0.36$) layer disposed on a top major surface of said substrate, an n-type $Al_yGa_{1-y}As$ ($0 \leq y \leq 0.1$) active region disposed on said first layer, a p-type $Al_xGa_{1-x}As$ second cladding layer disposed on said active region, said active region being capable of emitting stimulated radiation when said cladding layers are forward biased, and a $p^{++}$-type GaAs capping layer disposed on said second cladding layer; said multilayered structure having the shape of an elongated mesa extending parallel to the direction of light propagation;

a native oxide coating on the side walls of said mesa, the thickness of said oxide being less than the wavelength of said stimulated radiation as measured in said active region;

a fourth layer of p-type $Al_xGa_{1-x}As$ disposed on said mesa;

a fifth layer of $p^{++}$-type GaAs disposed on said fourth layer, said fourth and fifth layers being polycrystalline contiguous with said oxide and monocrystalline on the top of said mesa;

electrical contacts disposed on opposite major surfaces of said device; and means for forming an optical resonator for said radiation.

10. The device of claim 1 wherein the top of said mesa is about 4–8 μm wide; said mesa is about 100–380 μm long and has a height of about 2.5–3.5 μm; said oxide has a thickness of about 0.1 μm; and said fourth and fifth layers taken together are substantially as thick as the height of said mesa.

* * * * *